United States Patent
Idani

(10) Patent No.: US 7,250,644 B2
(45) Date of Patent: Jul. 31, 2007

(54) ELECTRONIC DEVICE AND METHOD FOR DESIGNING THE SAME

(75) Inventor: Naoki Idani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/081,727

(22) Filed: Mar. 17, 2005

(65) Prior Publication Data

US 2006/0131610 A1   Jun. 22, 2006

(30) Foreign Application Priority Data

Dec. 9, 2004   (JP) ............................ 2004-356497

(51) Int. Cl.
   *H01L 27/10* (2006.01)
   *H01L 29/739* (2006.01)
   *H01L 29/73* (2006.01)
   *H01L 29/76* (2006.01)
   *H01L 29/94* (2006.01)

(52) U.S. Cl. ................... 257/203; 257/202; 257/797; 257/798; 257/401; 438/800

(58) Field of Classification Search ........ 257/202–203, 257/797–798, 401; 438/800

See application file for complete search history.

(56) References Cited

U.S. PATENT DOCUMENTS

| | | | | |
|---|---|---|---|---|
| 5,566,080 A | * | 10/1996 | Yokoi | 716/1 |
| 5,789,791 A | * | 8/1998 | Bergemont | 257/401 |
| 5,886,363 A | * | 3/1999 | Hamada et al. | 257/48 |
| 6,404,030 B1 | * | 6/2002 | Ma et al. | 257/459 |
| 6,611,043 B2 | * | 8/2003 | Takiguchi | 257/565 |
| 6,649,985 B1 | * | 11/2003 | Nishimoto et al. | 257/401 |
| 2001/0011734 A1 | * | 8/2001 | Kanamoto et al. | 257/202 |
| 2003/0183854 A1 | * | 10/2003 | Kato et al. | 257/200 |
| 2004/0065907 A1 | * | 4/2004 | Maeno et al. | 257/211 |
| 2004/0083438 A1 | * | 4/2004 | Ohba et al. | 716/2 |

FOREIGN PATENT DOCUMENTS

| | | |
|---|---|---|
| JP | 9-102539 | 4/1997 |
| JP | 10-173035 | 6/1998 |
| JP | 2001-7114 | 1/2001 |
| JP | 2003-347406 | 12/2003 |

* cited by examiner

*Primary Examiner*—Ida M. Soward
(74) *Attorney, Agent, or Firm*—Westerman, Hattori, Daniels & Adrian, LLP.

(57) ABSTRACT

The electronic device includes a plurality of layout regions each including a plurality of patterns defined by a buried structure buried in a substrate. For each of the layout regions, in each of the layout regions, the minimum space between the patterns, and a maximum area percentage allowed for the patterns in the layout region are defined based on a size of the layout region. In larger one of the layout regions, the minimum space between the patterns in the region is set larger.

6 Claims, 17 Drawing Sheets

ELEMENT WIDTH: 4 μm
ELEMENT SPACE: 0.44 μm
ELEMENT AREA PERCENTAGE: 90%

ELEMENT WIDTH: 3 μm
ELEMENT SPACE: 0.33 μm
ELEMENT AREA PERCENTAGE: 90%

ELEMENT WIDTH: 2.3 μm
ELEMENT SPACE: 0.25 μm
ELEMENT AREA PERCENTAGE: 90%

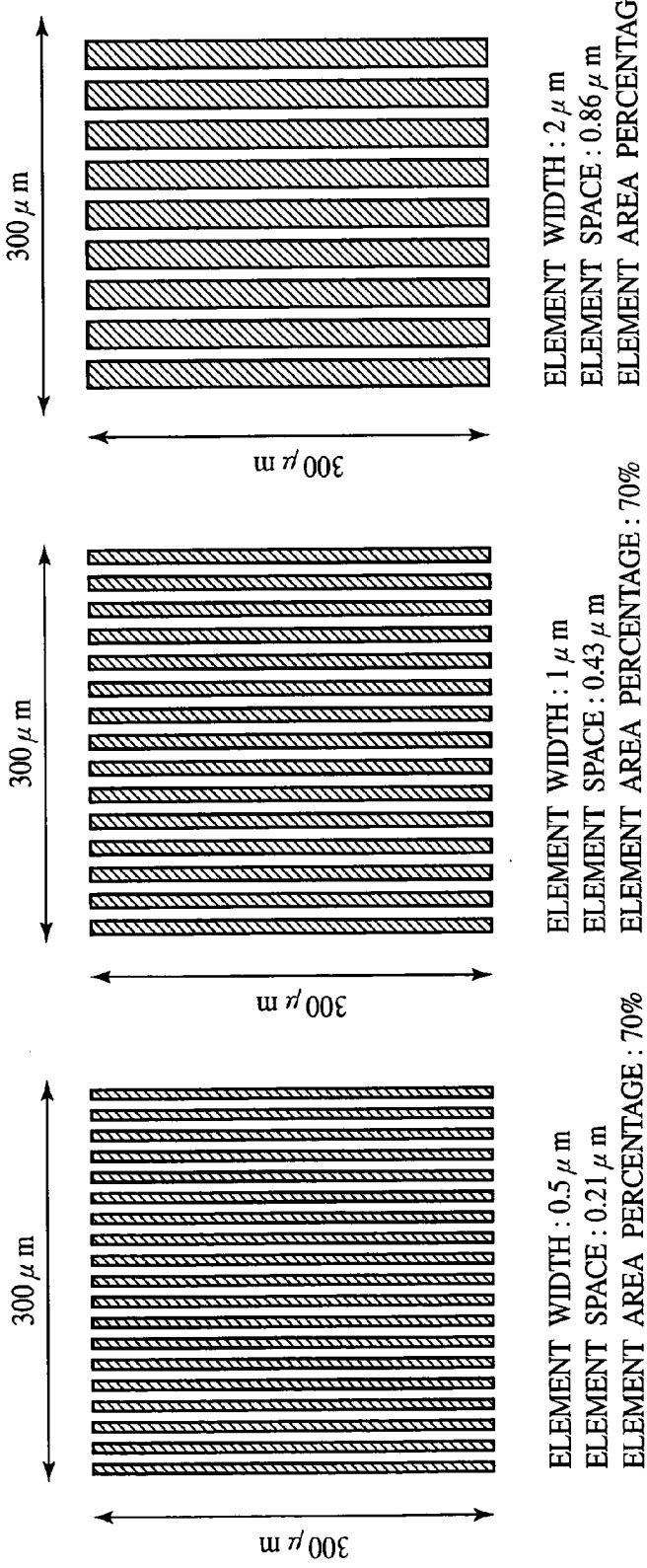

ELEMENT WIDTH: 5 μm
ELEMENT SPACE: 0.56 μm
ELEMENT AREA PERCENTAGE: 90%

ELEMENT WIDTH: 7.5 μm
ELEMENT SPACE: 0.83 μm
ELEMENT AREA PERCENTAGE: 90%

ELEMENT WIDTH: 10 μm
ELEMENT SPACE: 1.11 μm
ELEMENT AREA PERCENTAGE: 90%

ELEMENT WIDTH: 4 μm
ELEMENT SPACE: 1 μm
ELEMENT AREA PERCENTAGE: 80%

ELEMENT WIDTH: 3 μm
ELEMENT SPACE: 0.75 μm
ELEMENT AREA PERCENTAGE: 80%

ELEMENT WIDTH: 2 μm
ELEMENT SPACE: 0.5 μm
ELEMENT AREA PERCENTAGE: 80%

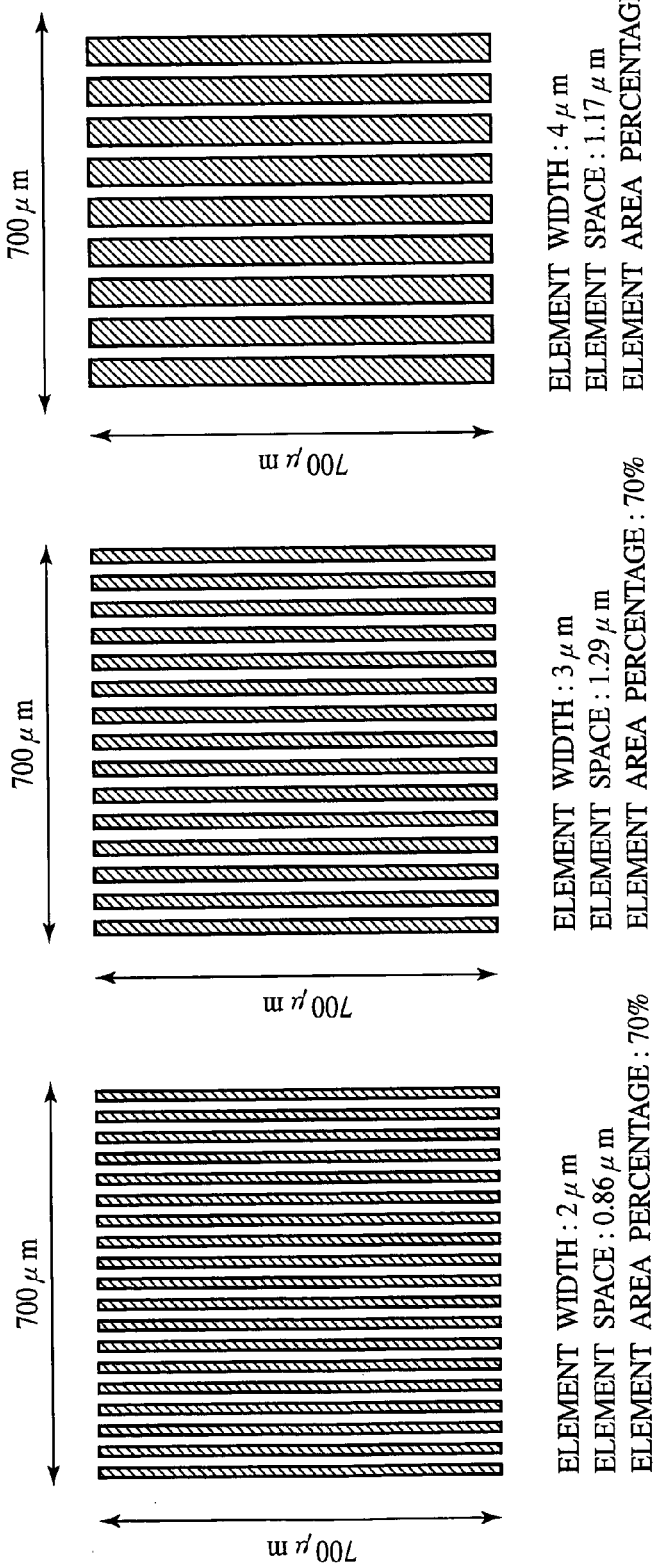

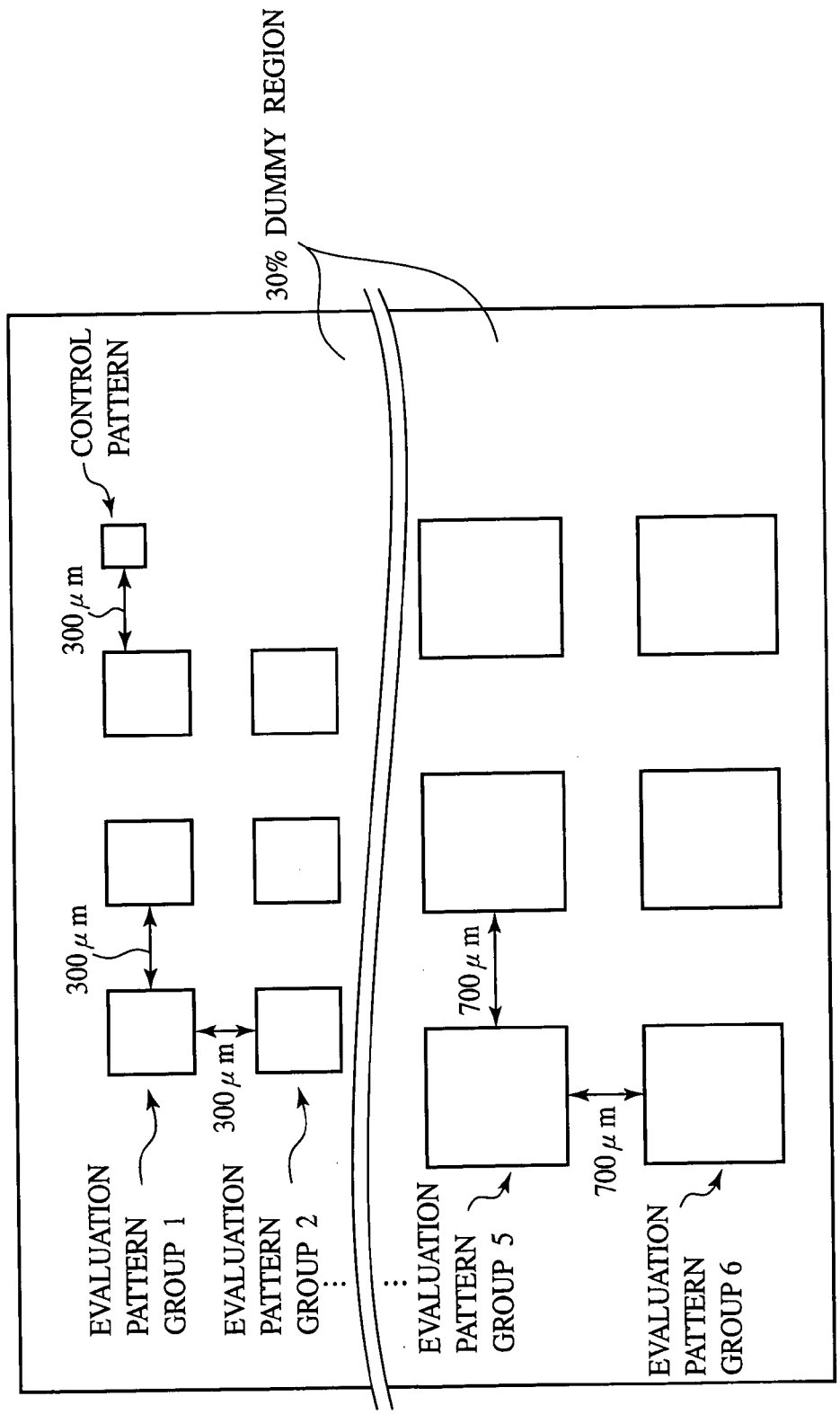

INTERCONNECTION SPACE 120 μm, 50%

INTERCONNECTION SPACE 200 μm, 60%

ELECTRONIC DEVICE AND METHOD FOR DESIGNING THE SAME

CROSS-REFERENCE TO RELATED APPLICATIONS

This application is based upon and claims the benefit of priority from the prior Japanese Patent Application No. 2004-356497, filed on Dec. 9, 2004, the entire contents of which are incorporated herein by reference.

BACKGROUND OF THE INVENTION

The present invention relates to an electronic device and a method for designing the same, more specifically an electronic device fabricated via the planarization step using CMP (Chemical Mechanical Polishing) and a method for designing the electronic device.

Electronic devices, such as semiconductor devices and magnetic heads, etc., use elements and interconnection structures of thin film layers. The fabrication of these elements often uses CMP method for planarizing the surfaces.

In the fabrication of semiconductor devices, for example, CMP is used in the step of forming the device isolation electrically isolating the elements formed on a semiconductor substrate, and in the step of forming the interconnection layers. That is, in the device isolation step using STI (Shallow Trench Isolation) method, CMP is used to planarize an insulating film which has been buried in trenches formed in the semiconductor substrate. Also in the interconnection forming step so called the damascene, CMP is used to planarize a conducting film which has been buried in trenches formed in an insulating film.

It is generally known that in the planarization by CMP, a surface state of an object to be polished influences characteristics of the CMP. For example, in a semiconductor device, the layout of patterns of the active regions, the interconnections, etc. influence characteristics of the CMP. This is due to the general properties of polishing, e.g., in a wide concave region, the polishing cloth tends to be deformed in polishing to cause excessive polishing of the film, and in a wide convex region, unpolished parts tend to take place at the central part.

The conventional methods for preventing layout of patterns from influencing the uniformity of the CMP are described in, e.g., Reference 1 (Japanese published unexamined patent application No. Hei 09-102539), Reference 2 (Japanese published unexamined patent application No. Hei 10-173035), Reference 3 (Japanese published unexamined patent application No. 2001-007114), and Reference 4 (Japanese published unexamined patent application No. 2003-347406).

Reference 1 discloses the method which, for the prevention of the generation of unpolished parts in a convex region, a buried material is etched with a mask having an inverted pattern of the trench pattern and then CMP is performed.

Reference 2 discloses the method which, for the prevention of concavities which are formed due to the density of convex patterns, active regions as dummy patterns are formed between active regions which are formed at a pitch of not less than 100 μm.

Reference 3 discloses the method which an area percentage of active regions present in a certain region is defined, whereby the uniformity of CMP is improved.

Reference 4 discloses the method which is an improvement of the method described in Reference 3 and which uses two windows of two different sizes to define area percentages of the active regions in chips. In the method described in Reference 4, an area percentage of active regions defined by the larger size window is made smaller than an area percentage defined by the smaller size window, whereby a layout of dense active regions is locally allowed, but active region are arranged less dense in a wide region.

SUMMARY OF THE INVENTION

The method described in Reference 1 requires, before the CMP step, the step of forming a mask the inverted pattern of a trench pattern and the step of etching off a buried material with the mask. These steps inevitably add to the fabrication cost.

The method described in Reference 2 is effective when all the active regions on a semiconductor substrate have small patterns of below 100 μm but is not effective depending on layouts of the active regions. For example, in a layout that regions in each of which 500 μm-square active region are laid out at a 1 μm-space are present continuously over an about 1 mm-range, and adjacent to these regions, regions in each of which 0.5 μm-square active regions are laid out at a 1 μm-space are laid out over an about 1 mm range, Reference 2 can allow such layout of the active regions. However, in the actual polishing, the polishing is insufficient in the region where 500 μm-square active regions are laid out at a 1 μm-space, and in the region where 0.5 μm-square active regions are laid out at a 1 μm-space, the polish is excessive.

The methods described References 3 and 4 are effective as a countermeasure to the method described in Reference 2. However, as devices are increasingly downsized in the recent electronic devices, the methods described in References 3 and 4 cannot allow the layouts of high-density patterns in wider regions.

An object of the present invention is to provide an electronic device which is fabricated via the planarization step using CMP, more specifically, an electronic device having a pattern layout which can reduce the influence on the CMP characteristics, and a method for designing the electronic device.

According to one aspect of the present invention, there is provided an electronic device comprising a plurality of layout regions each including a plurality of patterns defined by a buried structure buried in a substrate, for each of the layout regions, a minimum space between the patterns and a maximum area percentage allowed for the patterns being defined based on a size of the layout region, and in larger one of the layout regions, the minimum space between the patterns in the layout region being set larger.

According to another aspect of the present invention, there is provided an electronic device comprising a plurality of layout regions each including a plurality of patterns defined by a buried structure buried in a substrate, for each of the layout regions, a minimum space between the patterns and a maximum area percentage allowed for the patterns being defined based on a size of the layout region, and in that of the layout regions, where the maximum area percentage allowed for the patterns is higher, the minimum space between the patterns in the layout region being set larger.

According to further another aspect of the present invention, there is provided a method for designing an electronic device comprising a layout region including a plurality of patterns defined by a buried structure buried in a substrate, a minimum space between the patterns in the layout region, and a maximum area percentage allowed for the patterns in the layout region being set based on a size of the layout region.

According to the present invention, in an electronic device comprising a layout region where a plurality of patterns are defined by buried structures buried in a substrate, the minimum pitch between the patterns in the layout region and the maximum area percentage allowed for the patterns in the layout region are set based on a size of the layout region, whereby the residual step formed in forming the buried structures by CMP can be reduced. Thus, patterns can be laid out in high density on a substrate.

BRIEF DESCRIPTION OF THE DRAWINGS

FIGS. 2A-2C, 3A-3C, 4A-4C, 5A-5C, 6A-6C and 7A-7C are plan views of the evaluation patterns used in studying relationships among sizes of the layout regions, maximum areas of the active regions and minimum spaces among the active regions.

FIG. 8 is a plan view of a layout of the evaluation patterns and the control pattern on a semiconductor substrate.

DETAILED DESCRIPTION OF THE INVENTION

A First Embodiment

The electronic device and the method for designing the same according to a first embodiment of the present invention will be explained with reference to FIGS. 1 to 14.

Figure 1:
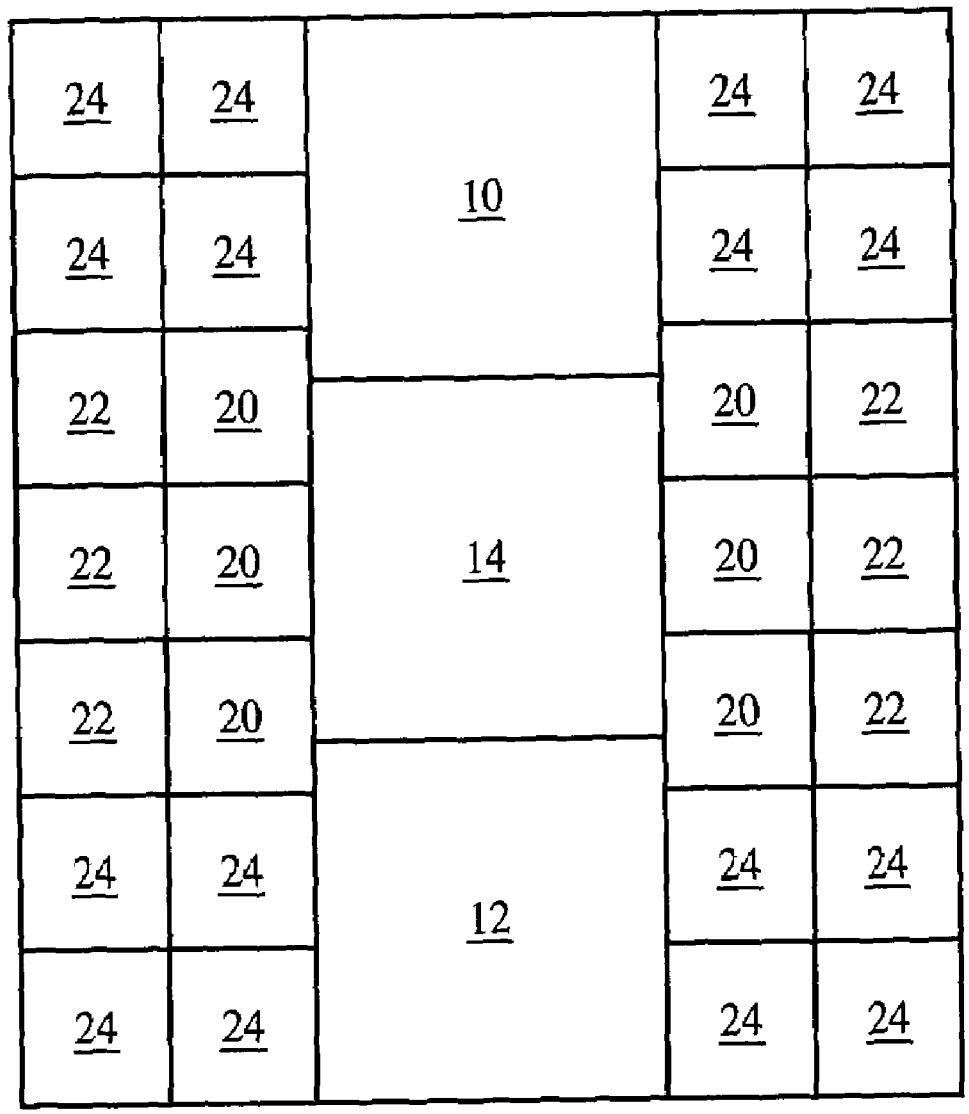
FIG. 1 is a plan view showing the electronic device and the method for designing the same according to a first embodiment of the present invention.
Figure 10:
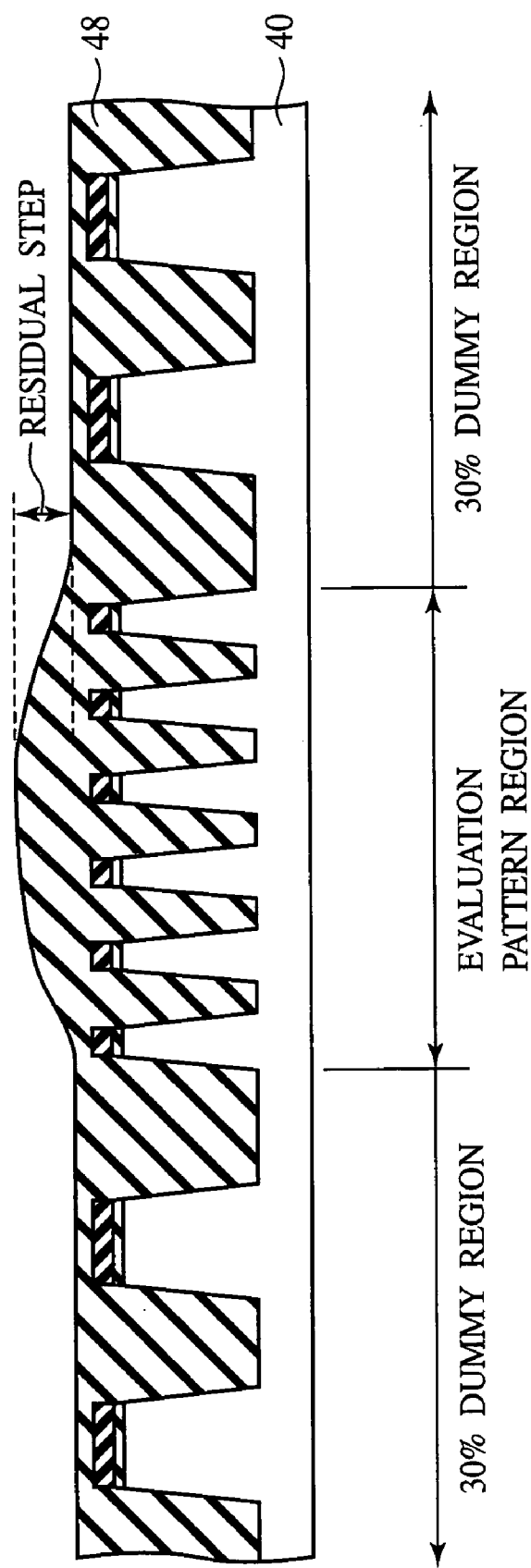
FIG. 10 is a diagrammatic sectional view of the evaluation patterns, which shows the residual steps on the evaluation patterns.
Figure 11:
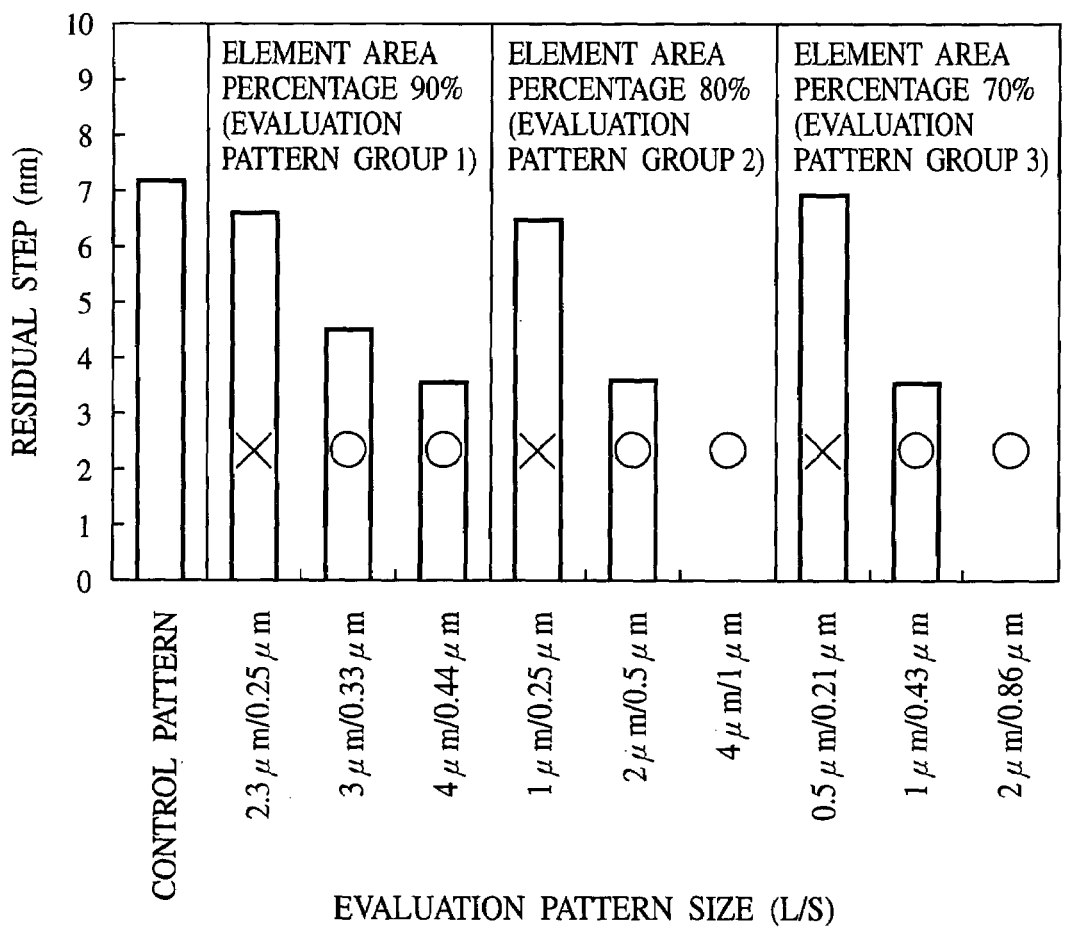
FIG. 11 is a graph showing the residual steps of Evaluation Pattern Groups 1 to 3 and the evaluation result based on the residual steps.
Figure 12:
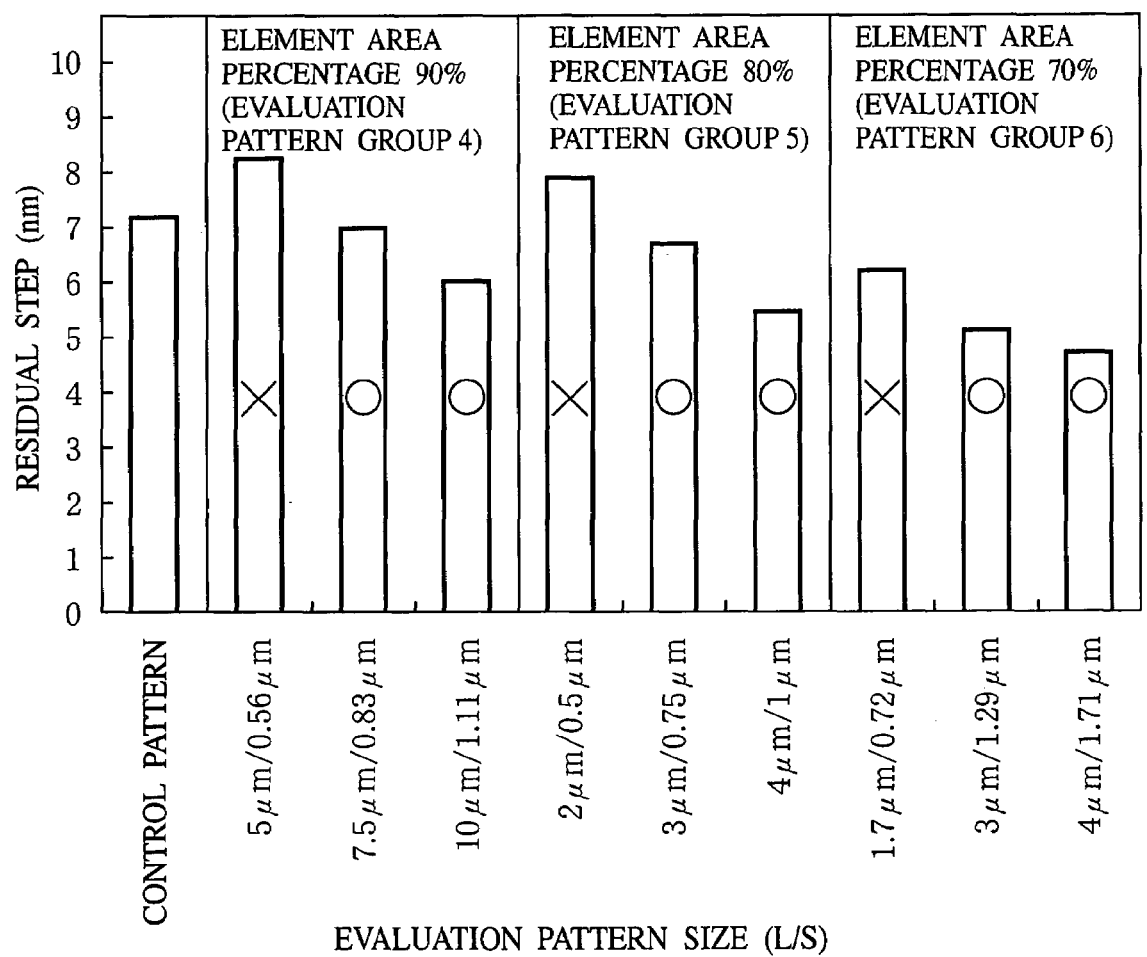
FIG. 12 is a graph showing the residual steps of Evaluation Pattern Groups 4 to 6 and the evaluation result based on the residual steps.
Figure 13:
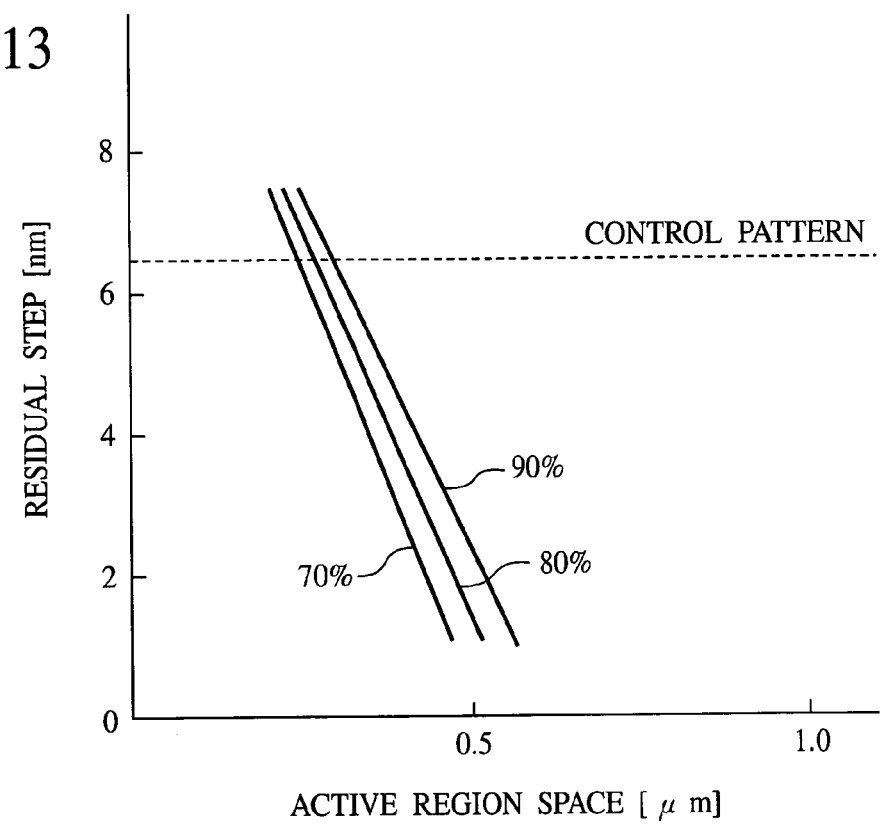
FIG. 13 is a graph of relationships between the residual steps and the minimum space between the active regions computed based on the result of FIG. 11.
Figure 14:
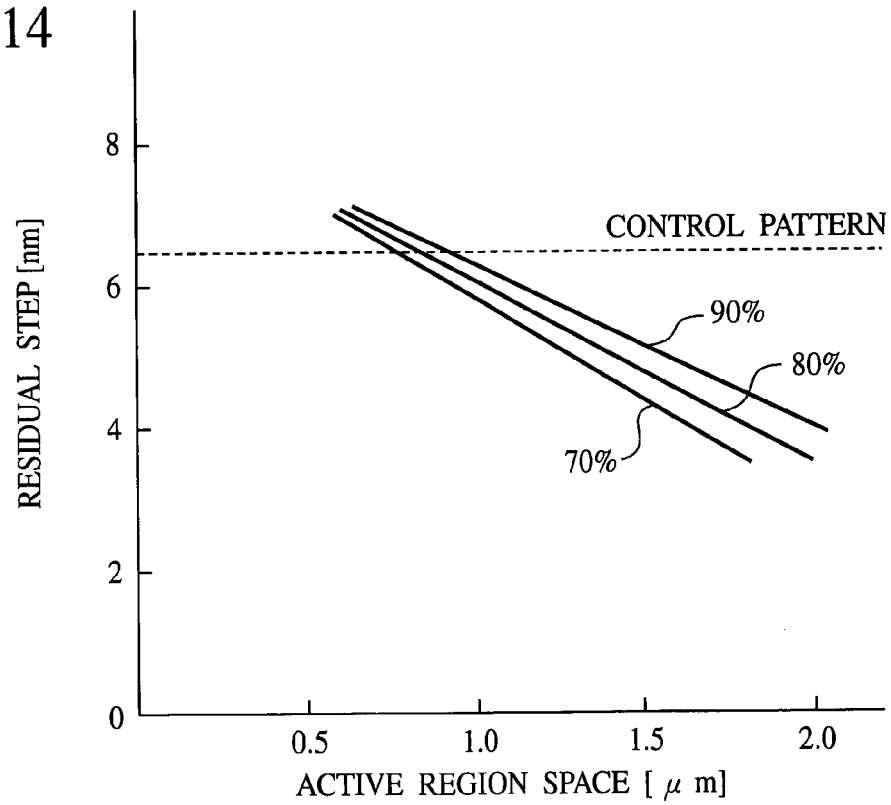
FIG. 14 is a graph of relationships between the residual steps and the minimum space between the active regions computed based on the result of FIG. 12.

FIG. 1 is a plan view showing the electronic device and the method for designing the same according to the present embodiment. FIGS. 2A-7C are plan views of the evaluation patterns used in studying relationships among sizes of the layout regions, maximum areas of the active regions and minimum spaces among the active regions. FIG. 8 is a plan view of a layout of the evaluation patterns and the control pattern on a semiconductor substrate. FIGS. 9A-9D are sectional views of the semiconductor device used in the evaluation in the steps of the method for fabricating the same, which show the method. FIG. 10 is a diagrammatic sectional view of the evaluation patterns, which shows the residual steps on the evaluation patterns. FIG. 11 is a graph showing the residual steps of Evaluation Pattern Groups 1 to 3 and the evaluation result based on the residual steps. FIG. 12 is a graph showing the residual steps of Evaluation Pattern Groups 4 to 6 and the evaluation result based on the residual steps. FIG. 13 is a graph of relationships between the residual steps and the minimum space between the active regions computed based on the result of FIG. 11. FIG. 14 is a graph of relationships between the residual steps and the minimum space between the active regions computed based on the result of FIG. 12.

First, the structure and the method for designing the electronic device according to the present embodiment will be explained with reference to FIG. 1. The electronic device according to the present embodiment is a semiconductor device, and an object to be polished by CMP is silicon oxide film to be the device isolation film.

As shown in FIG. 1, on the semiconductor substrate there are provided 700 μm-square layout regions 10, 12, 14 and 300 μm-square layout regions 20, 22, 24. The layout region means a unit block of, a circuit design.

The layout regions 10, 20 are regions where the maximum area percentage of the active regions is 70%. The layout regions 12, 22 are regions where the maximum area percentage of the active regions is 80%. The layout regions 14, 24 are regions where the maximum area percentage of the active regions is 90%.

Here, the electronic device according to the present embodiment is characterized in that the minimum spaces between the active regions in the respective layout regions and the maximum area percentages of the active regions in the respective layout regions are suitably set in accordance with the sizes of the respective layout regions.

To be specific, in the 700 μm-square layout regions 10, 12, 14, the minimum space between the active region in the layout region 10, where the maximum area percentage of the active regions is 70, is 0.75 μm; the minimum space between the active regions in the layout region 12, where the maximum area percentage of the active regions is 80%, is 0.81 μm; and the minimum space between the active regions in the layout region 14, where the maximum area percentage of the active regions is 90%, is 0.87 μm.

In the 300 μm-square layout regions 20, 22, 24, the minimum space between the active region in the layout region 20, where the maximum area percentage of the active regions is 70%, is 0.25 μm; the minimum space between the active region in the layout region 22, where the maximum area percentage of the active regions is 80%, is 0.27 μm; and the minimum space between the active regions in the layout region 14, where the maximum area percentage of the active regions is 90%, is 0.30 μm.

That is, the minimum spaces between the active regions in the respective layout regions are larger as the layout regions are wider. The minimum spaces between the active regions in the respective layout regions are larger as the maximum area percentages of the active regions are larger.

For the respective layout regions on a semiconductor substrate, the minimum space between the active regions and a required maximum area percentage of the active regions are thus suitably set in accordance with the sizes of the layout regions, whereby residual steps after the CMP in the step of forming the device isolation film can be lowered. Thus, the active regions can be formed in higher density on the semiconductor substrate.

The reason for setting the minimum spaces between the active region and the maximum area percentages of the active regions in accordance with the sizes of the respective layout regions in the electronic device according to the present embodiment will be explained based on the result of the studies made by the inventor of the present application.

First, in which region the CMP becomes difficult was evaluated with the area percentage of the active regions and the pitch of the active regions varied. For the evaluation, the evaluation patterns shown in FIGS. 2A to 7C were used.

Figure 2C:
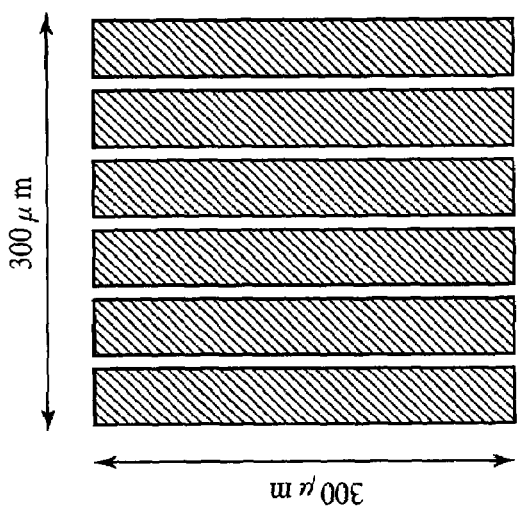
Figure 2B:
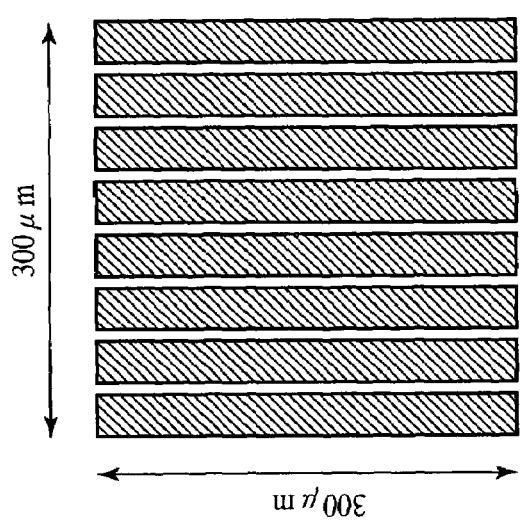
Figure 2A:
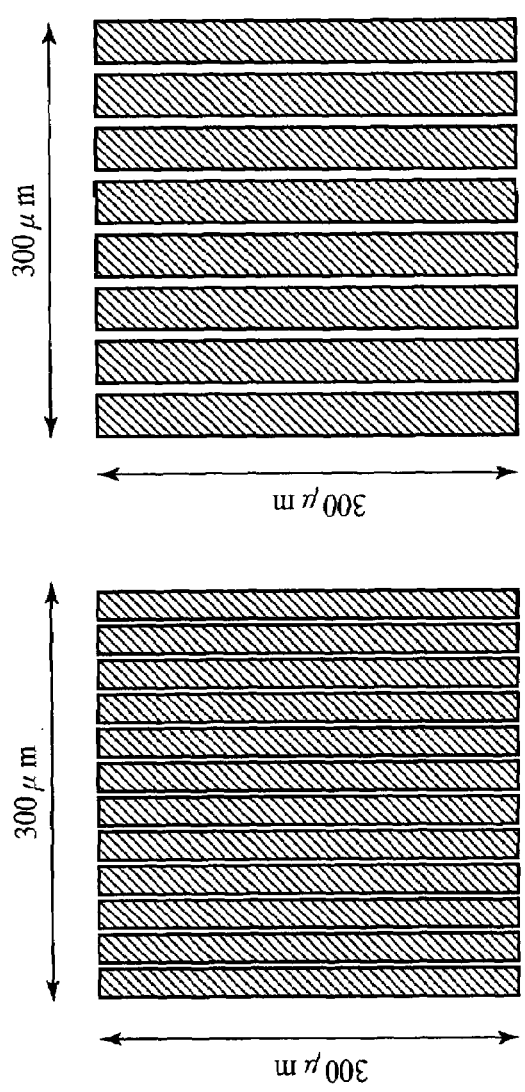

The evaluation patterns shown in FIG. 2A to 2C are all for the element area percentage (active region percentage) of 90% in 300 μm-square regions (Evaluation Pattern Group 1). The evaluation pattern shown in FIG. 2A is for the element (active region) width of 2.3 μm and the element (active region) space of 0.25 μm. The evaluation pattern shown in FIG. 2B is for the element (active region) width of 3 μm and the element (active region) space of 0.33 μm. The evaluation pattern shown in FIG. 2C is for the element (active region) width of 4 μm and the element (active region) space of 0.44 μm.

Figure 3A:
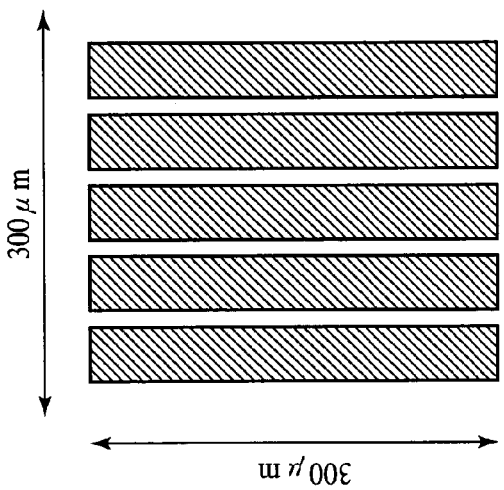
Figure 3B:
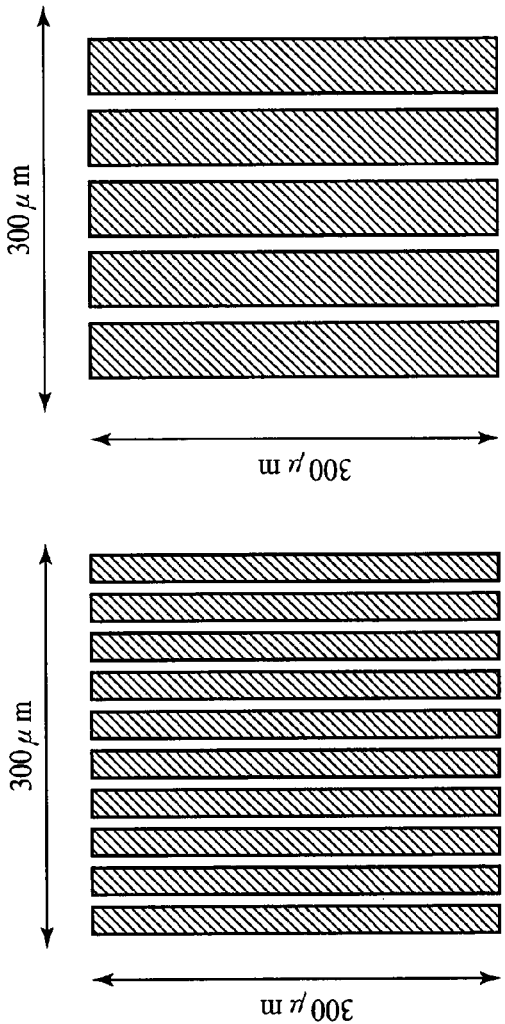
Figure 3C:
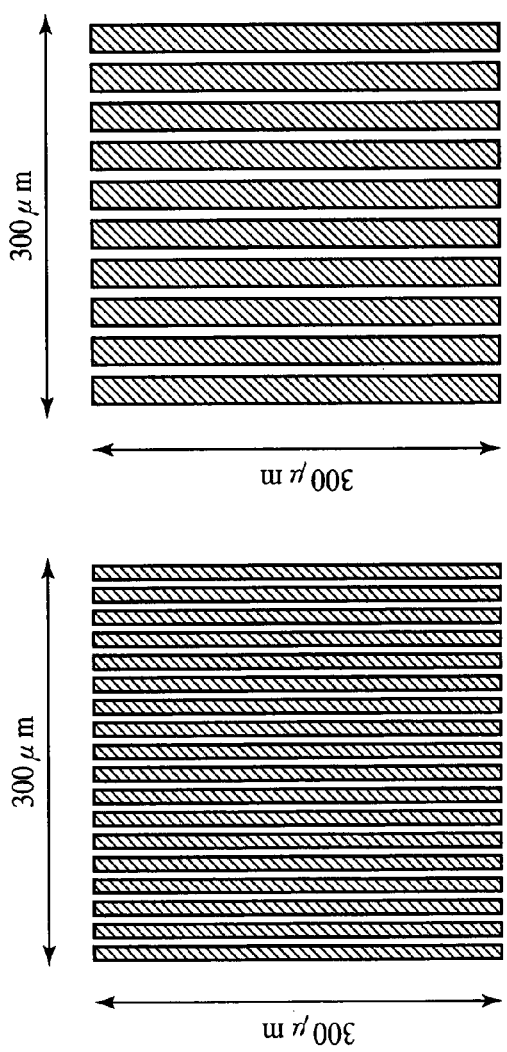

The evaluation patterns shown in FIG. 3A to 3C are all for the element area percentage of 80% in 300 μm-square regions (Evaluation Pattern Group 2). The evaluation pattern shown in FIG. 3A is for the element width of 1 μm and the element space of 0.25 μm. The evaluation pattern shown in FIG. 3B is for the element width of 2 μm and the element space of 0.5 μm. The evaluation pattern shown in FIG. 3C is for the element width of 4 μm and the element space of 1 μm.

The evaluation patterns shown in FIG. 4A to 4C are all for the element area percentage of 70% in 300 μm-square regions (Evaluation Pattern Group 3). The evaluation pattern shown in FIG. 4A is for the element width of 0.5 μm and the element space of 0.21 μm. The evaluation pattern shown in FIG. 4B is for the element width of 1 μm and the element space of 0.43 μm. The evaluation pattern shown in FIG. 4C is for the element width of 2 μm and the element space of 0.86 μm.

Figure 5A:
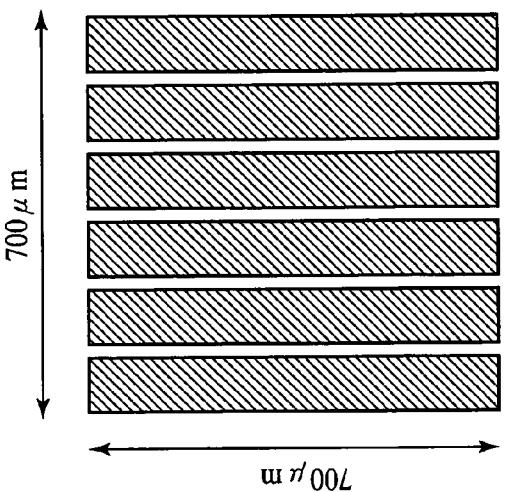
Figure 5B:
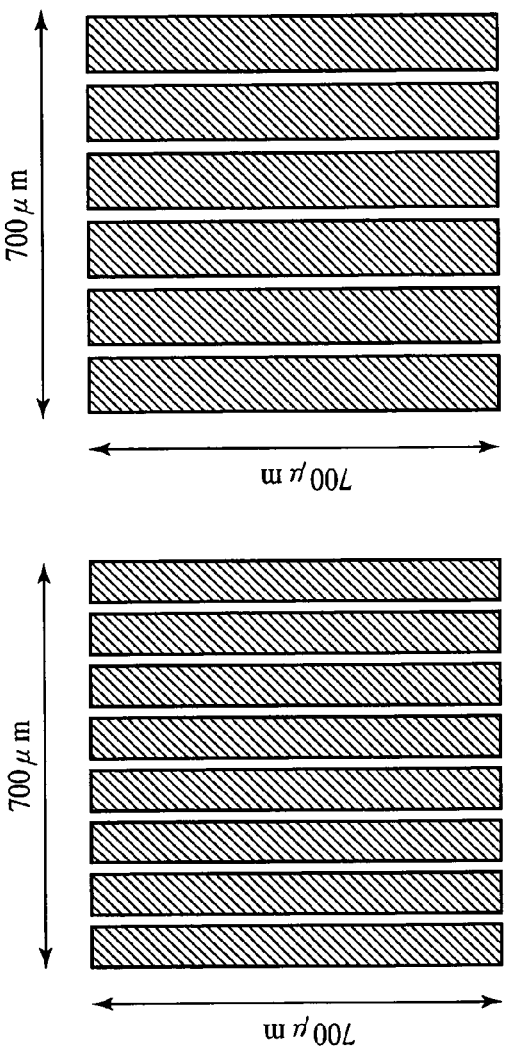
Figure 5C:
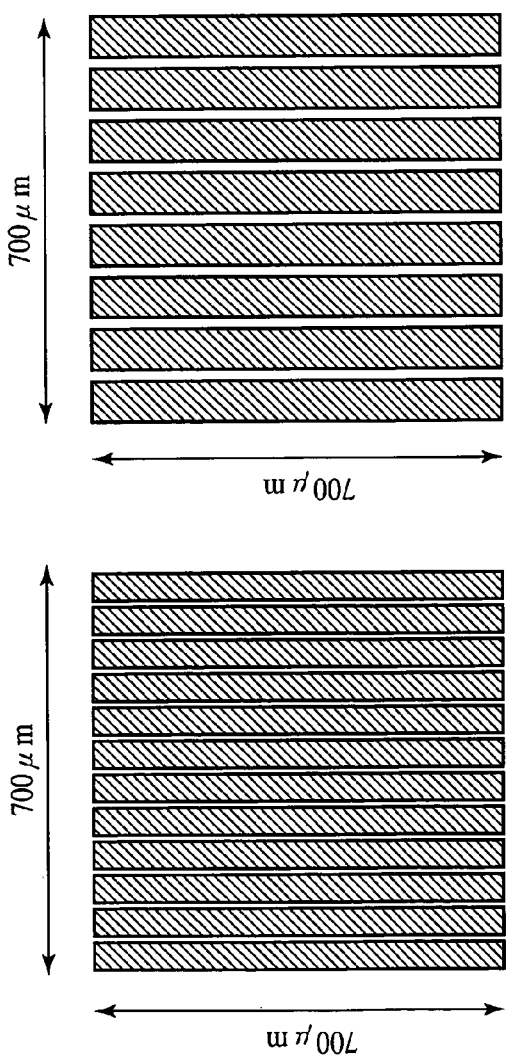

The evaluation patterns shown in FIG. 5A to 5C are all for the element area percentage of 90% in 700 μm-square regions (Evaluation Pattern Group 4). The evaluation pattern shown in FIG. 5A is for the element width of 5 μm and the element space of 0.56 μm. The evaluation pattern shown in FIG. 5B is for the element width of 7.5 μm and the element space of 0.83 μm. The evaluation pattern shown in FIG. 5C is for the element width of 10 μm and the element space of 1.11 μm.

Figure 6C:
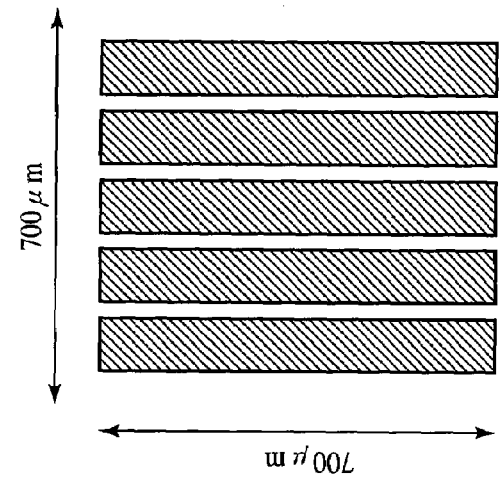
Figure 6B:
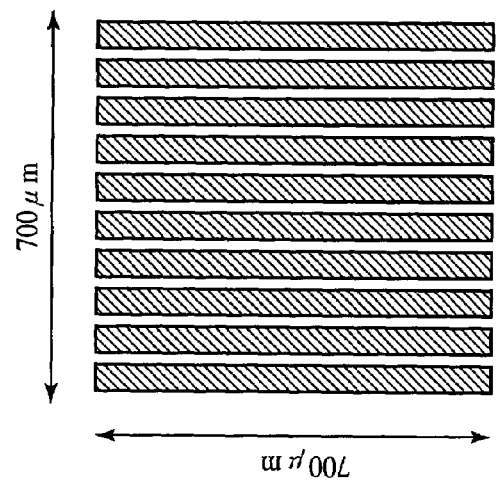
Figure 6A:
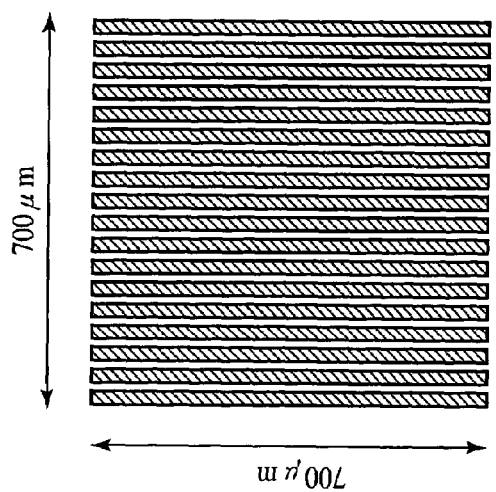

The evaluation patterns shown in FIG. 6A to 6C are all for the element area percentage of 80% in 700 μm-square regions (Evaluation Pattern Group 5). The evaluation pattern shown in FIG. 6A is for the element width of 2 μm and the element space of 0.5 μm. The evaluation pattern shown in FIG. 6B is for the element width of 3 μm and the element space of 0.75 μm. The evaluation pattern shown in FIG. 6C is for the element width of 4 μm and the element space of 1 μm.

The evaluation patterns shown in FIG. 7A to 7C are all for the element area percentage of 70% in 700 μm-square regions (Evaluation Pattern Group 6). The evaluation pattern shown in FIG. 7A is for the element width of 2 μm and the element space of 0.86 μm. The evaluation pattern shown in FIG. 7B is for the element width of 3 μm and the element space of 1.29 μm. The evaluation pattern shown in FIG. 7C is for the element width of 4 μm and the element space of 1.17 μm.

In addition to the Evaluation Pattern Groups 1 to 6, as a control pattern, a pattern of the area percentage of 100% for a 100 μm-square was prepared. The control pattern is a reference pattern for judging whether or not the polishing by the CMP is being performed without any problem.

As shown in FIG. 8, the periphery of the Evaluation Pattern Groups 1 to 6 and the control pattern was a dummy region (30% dummy region) where 2 μm-square active regions are laid out by an area percentage of 30%. The Evaluation Pattern Groups 1 to 3 were laid out at a 300 μm-pitch with respect to each other, and the evaluation pattern groups 4 to 6 were laid out at a 700 μm-pitch with respect to each other. The Evaluation Pattern Groups 1 to 3 and the control pattern were laid out at a 300 μm-pitch with respect to each other.

An evaluation sample having the above-described evaluation patterns was formed on a silicon substrate 40 by the steps shown in FIG. 9.

First, a 10 nm-thick silicon oxide film 42 was formed on the silicon substrate by thermal oxidation.

Figure 9A:
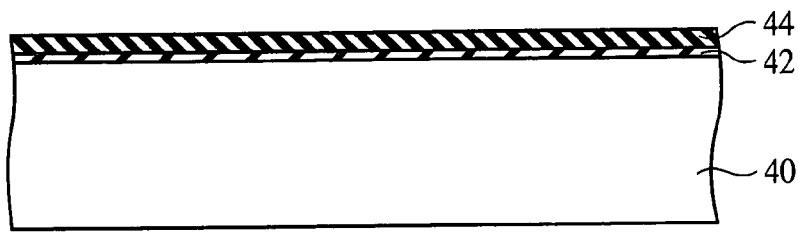
FIGS. 9A-9D are sectional views of the semiconductor device used in the evaluation in the steps of the method for fabricating the same, which show the method.

Next, a 100 nm-thickness silicon nitride film 44 was formed on the silicon oxide film 42 by CVD method (FIG. 9A).

Figure 9B:
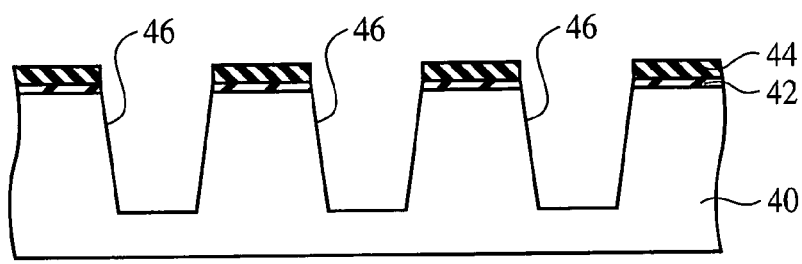

Next, by photolithography and dry etching, the silicon nitride film 44, the silicon oxide film 42 and the silicon substrate 40 were patterned to form 300 nm-depth device isolation trenches having the above-described evaluation patterns (FIG. 9B).

Figure 9C:
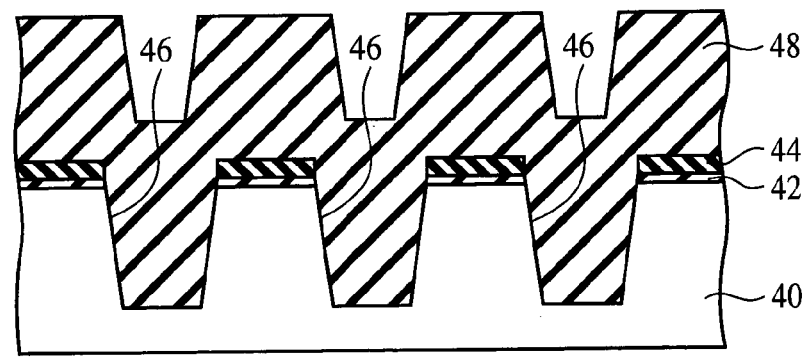

Next, a liner oxide film (not shown) is formed on the inside surfaces of the device isolation trenches 46 by thermal oxidation. Then, a 500 nm-thick silicon oxide film 48 was deposited by CVD (FIG. 9C).

Figure 9D:
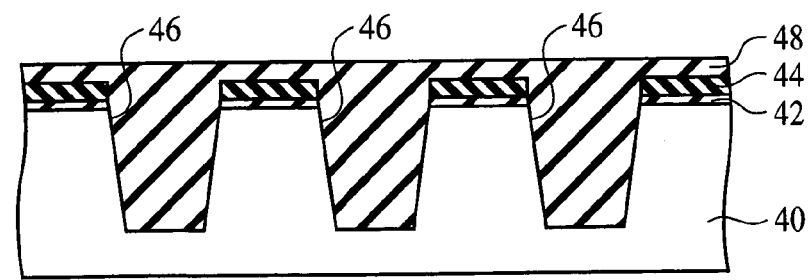

Then, the surface of the silicon oxide film 48 was polished by CMP method (FIG. 9D). At this time, although in the usual polishing process, the polishing is performed until the silicon oxide film 48 on the silicon nitride film 44 is completely removed, the silicon oxide film 48 is left on the silicon nitride film in the present evaluation by ending the polishing in a period of time shorter by about 10 seconds than the period of time required to completely remove the silicon oxide film 48 on the silicon nitride film 44 to thereby leave the silicon oxide film 48 on the silicon nitride film 44 (the so-called underpolishing).

The polishing was conducted by using IC1400 from Rodel Nitta Co. as the polishing pad, and the slurry of ceria with polyacryl ammonium salt added to by about 1% was fed by about 0.2 liters per 1 minute. The polishing pressure and linear velocity were set respectively at 0.3 kg wt/cm$^2$ and about 13 m/sec.

After the underpolishing, the control pattern and the evaluation patterns were respectively measured for residual steps by HRP-100 from KLA-Tencor Co. The residual step is, as shown in FIG. 10, a difference between a height of the surface of the silicon oxide film 48 on the evaluation pattern to be measured, and a height of the surface of the silicon oxide film 48 on the 30% dummy region.

An evaluation pattern having a residual step larger than a residual step on the control pattern is judged to be a pattern which is difficult to polish, and evaluation patterns having a residual step smaller than the residual step on the control pattern is judged to be a pattern having a margin for the polish.

FIG. 11 is a graph showing the residual steps of the evaluation patterns 1 to 3 and the control pattern, and the result of the evaluation based on their residual steps. FIG. 12 is a graph showing the residual steps of the evaluation patterns 4 to 6 and the control pattern, and the result of the evaluation based on their residual steps. In the graphs, the graphs of the evaluation patterns judged difficult to polish are marked the x marks, and the evaluation patterns judged to have margins for the polish are marked with the o marks.

As evident in FIGS. 11 and 12, in any of the 300 µm-square evaluation patterns (Evaluation Pattern Groups 1 to 3) and the 700 µm-square evaluation patterns (Evaluation Pattern Groups 4 to 6), it is found that the height of the residual step much depends on the space between the active regions rather than the pattern area percentage.

Relationships between the residual step and the space between the active regions expressed based on the graph of FIG. 11 are as shown in FIG. 13. Relationships between the residual step and the space between the active regions expressed based on the graph of FIG. 12 are as shown in FIG. 14. In FIGS. 13 and 14, the dotted lines indicate the residual steps of the control pattern.

Based on the result given in FIG. 13, the space between the active regions necessary for the residual step in the patterns of not more than 300 µm-square to be in an allowable range (less than 6.5 nm) is not less than about 0.25 µm when the maximum area percentage is 70%, not less than about 0.27 µm when the maximum area percentage is 80%, and not less than about 0.3 µm when the maximum area percentage is 90%.

That is, in the usual design rule, even when the area percentage of the active regions of up to about 60% is allowed, a certain rule is set for the space of the active regions to thereby more densely lay out the active regions.

Similarly, based on the result given in FIG. 14, the space between the active regions necessary for the residual step in the patterns of not more than 700 µm-square to be in an allowable range (less than 6.5 nm) is not less than about 0.75 µm when the maximum area percentage is 70%, not less than about 0.81 µm when the maximum area percentage is 80%, and not less than about 0.87 µm when the maximum area percentage is 90%.

That is, when a denser pattern is to be formed in a wider region than the patterns shown in FIG. 11, it is necessary to further increase the space between the active regions.

Based on the synthesis of the results given in FIGS. 11 to 14, a space between the active regions to be formed is set in accordance with a region where the active regions are to be formed and a density of the active regions, whereby active regions can be formed in higher density on the electronic device.

Based on the results given in FIGS. 11 to 14, the relationship between a minimum space Y [µm] required for the active regions, and a maximum area percentage X [%] of the active regions is expressed by the following formula.

$Y=(X-b)/a$

Here, a and b are expressed respectively as follows when a length of one side of a frame used in giving the area percentage is L [µm]:

$a=-0.574 \times L+566.94$ $b=-0.0633 \times L-8.908$

This formula is applicable to the range that the maximum area percentage X is about $70 \leq X \leq 90$, and the length L of one side of the frame is about $300 \leq L \leq 850$.

A certain relationship can be found among the minimum space Y [µm] required for active regions, the maximum area percentage of the active regions X [%] and the length L [µm] of the frame to be used in giving the area percentage. Accordingly, the length of one side of the layout region used in giving the area percentage is given, whereby the maximum area percentage of the active regions and the minimum space required for the active regions can be suitably decided.

The relationship between a size of a layout region, a maximum area percentage of the active regions and a minimum space among the active regions was given under conditions which are considered most severe for the CMP with a line-and-space pattern laid all over a layout region. Accordingly, in an actual electronic device, if a pattern is laid, satisfying the above-described relationship in most (e.g., not less than about 60%) of a layout region, characteristics of the CMP are not influenced even when the pattern does not satisfy the above-described relationship in the rest part.

As described above, according to the present embodiment, in designing an electronic device including a device isolation film formed by STI method, a minimum space between the active regions and a required maximum area percentage of the active regions are suitably set in accordance with a size of each layout region, whereby the residual step after CMP in the step of forming the device isolation film can be reduced. Thus, active regions can be formed in higher density on a semiconductor substrate.

A Second Embodiment

The electronic device and the method for designing the same according to a second embodiment of the present invention will be explained with reference to FIGS. 15A to 17B.

Figure 15A:
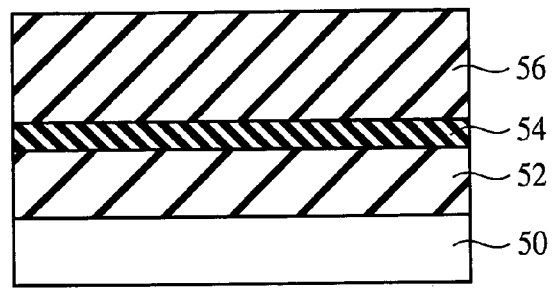
FIGS. 15A-15D are sectional views of a semiconductor device in the steps of the method for fabricating the same, which show the general interconnection layer forming method using damascene process.
Figure 15B:
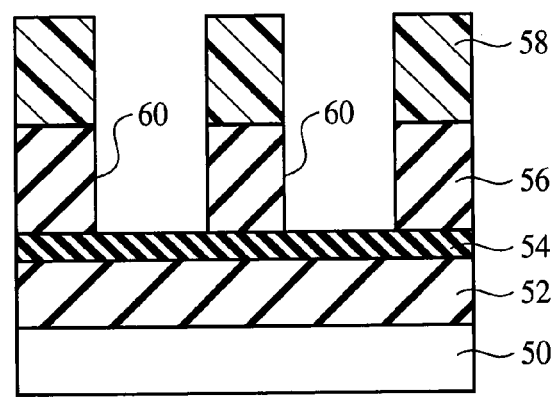
Figure 15C:
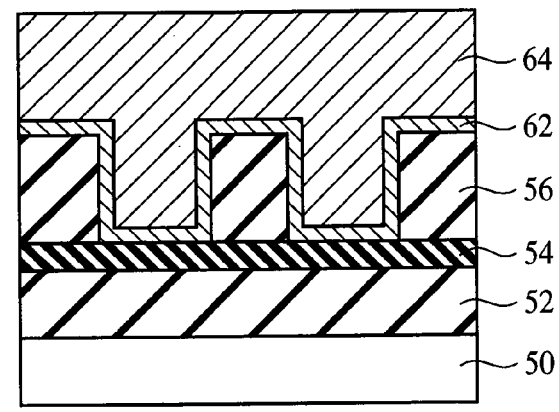
Figure 16:
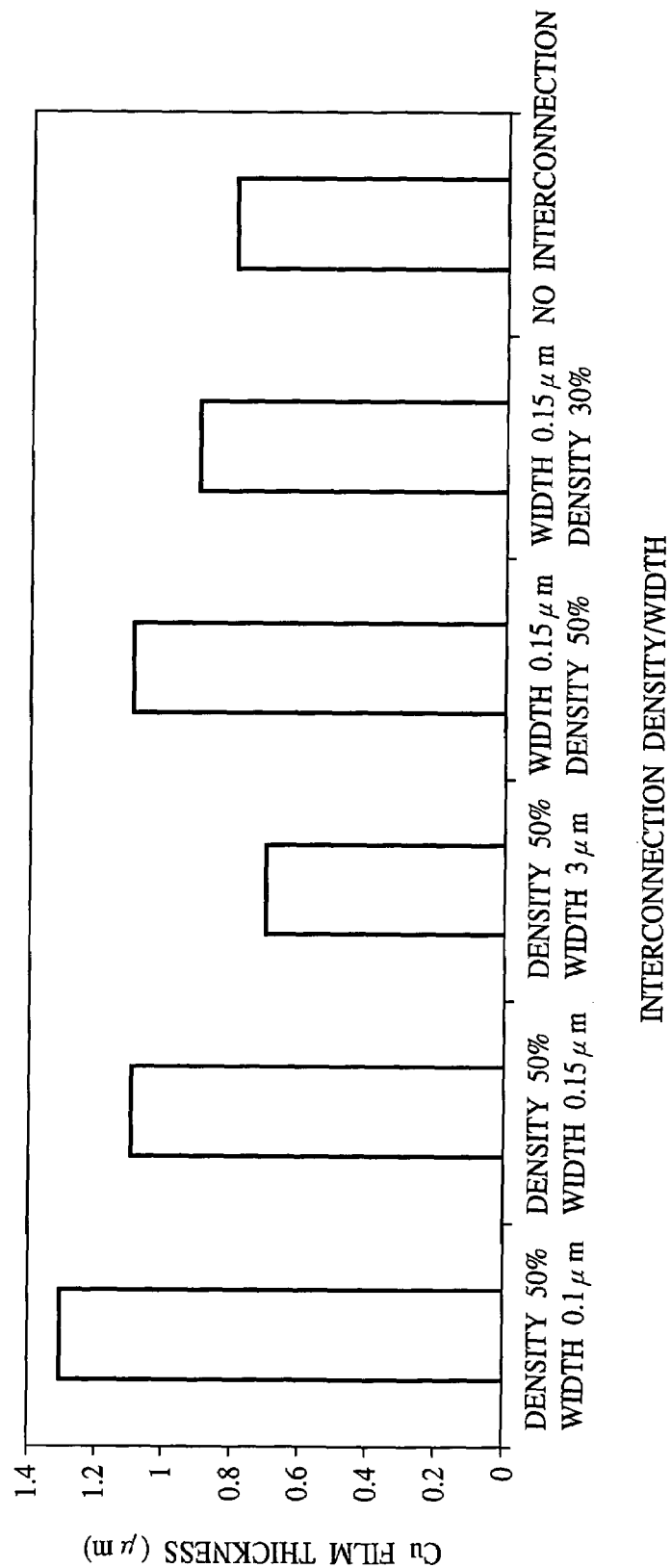
FIG. 16 is a graph showing changes of the Cu film thickness with the interconnection space and density varied.
Figure 17A:
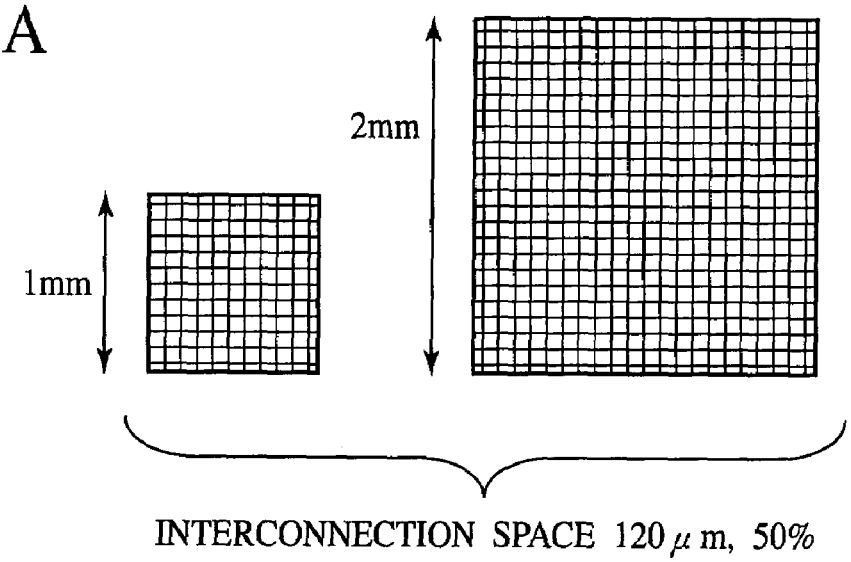
FIG. 17 is views of one example of the design pattern used in studying the pattern dependency of the overplating.
Figure 17B:
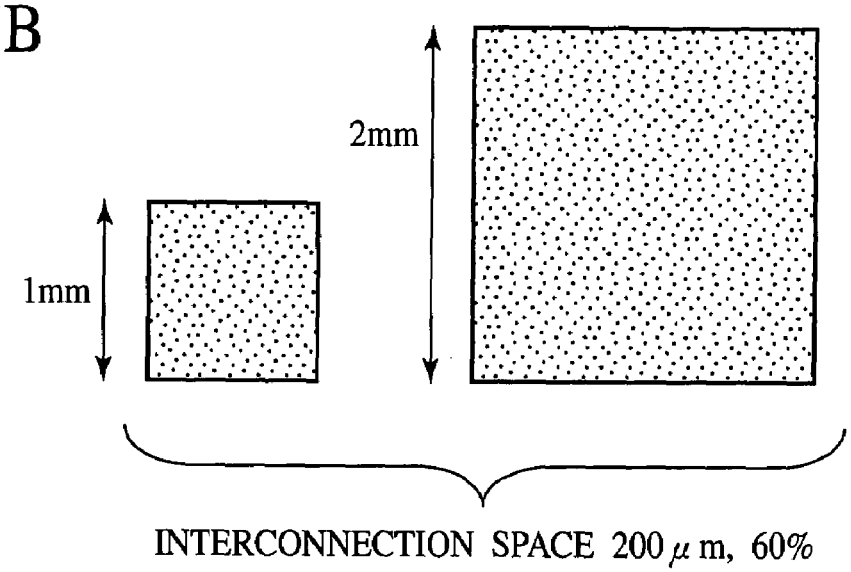

FIGS. 15A-15C are sectional views of the electronic device in the steps of the general method of forming interconnection layers by damascene process. FIG. 16 is a graph showing changes of a Cu film thickness with the interconnection space and density changed. FIGS. 17A and 17B are views of examples of design patterns used in studying the pattern dependency of the overplating.

The electronic device according to the present embodiment is a semiconductor device, and the object to be polished by CMP is conducting films to be the interconnection layers.

First, the general method for forming interconnection layers by the so-called damascene process will be explained with reference to FIGS. 15A-15C.

First, a silicon oxide film of, e.g., a 300 nm-thick is formed on a silicon substrate 50 by, e.g., plasma CVD method to form an inter-layer insulating film 52 of the silicon oxide film.

Next, on the inter-layer insulating film 52, a silicon nitride film of, e.g., a 20 nm-thick is deposited by, e.g., plasma CVD method to form an etching stopper film 54 of the silicon nitride film.

Next, on the etching stopper film 54, a silicon oxide film of, e.g., a 450 nm-thick was deposited to form an inter-layer insulating film 56 of the silicon oxide film (FIG. 15A).

Next, by photolithography, a photoresist film 58 exposing a region for an interconnection layer to be formed is formed on the inter-layer insulating film 56.

Next, the inter-layer insulating film 56 is dry etched with the photoresist film 58 as the mask to form interconnection trenches 60 in the inter-layer insulating film 56 (FIG. 15B).

Next, the photoresist film 58 is removed, and then a TaN film of, e.g., a 25 nm-thick is deposited by, e.g., sputtering method to form a diffusion barrier film 62 of the TaN film.

Next, a Cu film of, e.g., a 20 nm-thick is formed on the diffusion barrier film 62 by, e.g., sputtering method.

Next, by using as the seed the Cu film deposited by sputtering, a Cu film 64 of, e.g., a 1.3 µm-thickness is formed by electrolytic plating method (FIG. 15C).

Figure 15D:
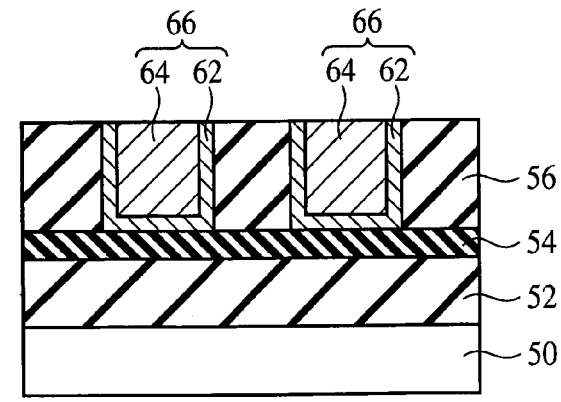

Next, the Cu film 64 and the diffusion barrier film 62 are planarized by CMP method until the upper surface of the inter-layer insulating film 56 is exposed. Thus, an interconnection layers 66 of the barrier film 62 and the Cu film 64 which are buried in the interconnection trenches 60 are formed (FIG. 15D).

Thus, even on the interconnection layer formed of the damascene interconnection, the pattern of the interconnection trenches 60 formed in the inter-layer insulating film 56 are reflected on the surface state of the Cu film to be polished, which influences the polishing characteristics of the CMP, as is in the first embodiment, in which the device isolation film is formed by STI method.

Recently, as the electrolytic plating used in burying the Cu film 64, a burying method using the growth mechanism which is called the bottom up growth mode is used. The bottom up growth mode is different from the conventional conformal growth mode, in which a film homogeneously grows from the side wall and the bottom surface of a trench or a hole, and is characterized in that a film grows preferentially on the bottom surface of a trench or a hole. Accordingly, the probability of voids and seams remaining in trenches and holes is lower than in the conformal growth mode, and trenches and holes of higher aspect ratios can be buried.

On the other hand, when the Cu film is grown by bottom up growth mode, the phenomena that the formed Cu film is convex over the trenches and holes and is thicker there than at the plane parts (overplating phenomena) takes place due to the higher growth rate in the trenches and holes.

FIG. 16 is a graph showing changes of the Cu film thickness with the interconnection density and the interconnection width changed. When the Cu film is grown by bottom up growth mode, the overplating is larger as the interconnection density is higher and the interconnection width is smaller.

As the design rule is increasingly downsized, the Cu interconnection width is more downsized, and the Cu interconnections are made denser for higher performance of the device, which makes the local Cu film increase more conspicuous. When a region where the Cu film is thicker are small, the polishing by the CMP has no problem. However, when a region where the Cu film is thicker is wide, the Cu film is left on the inter-layer insulating film 56, which causes short circuits between the interconnections. Thus, the overplating increase is a serious factor for blocking the polishing of the Cu film by the CMP.

Accordingly, in forming the Cu interconnection layer by damascene process as well, a minimum space between the interconnections and a maximum area percentage of the interconnections may be set in accordance with sizes of respective layout regions, as are in the first embodiment of the present invention.

In view of this, the overplating amount changes with changes of the interconnection density and the interconnection space were studied. That is, as shown in FIG. 17, patterns having a 120 nm-space between interconnections and a 50% interconnection density are laid in a 1 mm-square area and a 2 mm-square areas (FIG. 17A), and patterns having a 200 nm-space between interconnections and a 60% interconnection density are laid in a 1 mm-square area and a 2 mm-square areas (FIG. 17B). After the Cu polishing by the CMP, the residual films were compared.

The result was that in the patterns shown in FIG. 17A, the polishing in the 1 mm-square region was normal, but polishing residues took place in the 2 mm-square region. On the other hand, in the patterns shown in FIG. 17B, the polishing was normal both in the 1 mm-square region and the 2 mm-square region. These mean that the Cu interconnection formed by damascene process can be formed also in higher density as the layout region is smaller. These also mean that denser pattern layouts can be realized by making the space between interconnections larger. This is because the overplating amount is made smaller by making the interconnection space larger, and this facilitates the Cu polishing.

As described above, according to the present embodiment, also in the Cu interconnection layer formed by damascene process as well as in the first embodiment of the present invention, minimum spaces between interconnections and maximum area percentages are set in accordance with respective layout regions, whereby the overplating of the Cu film is suppressed, and resultantly the generation of Cu residues after the CMP can be prevented. Thus, denser interconnections can be laid out on a semiconductor substrate.

Modified Embodiments

The present invention is not limited to the above-described embodiments and can cover other various modifications.

For example, in the first embodiment, the layout regions are a 300 µm-square and a 700 µm-square, and in the second embodiment, the layout regions are a 1 mm-square and a 2 mm-square. However, the present invention is not limited to layout regions of these sizes. Similarly, the space between the active regions and the density of the active regions, the space between the interconnections and the density of the interconnections are not limited to the values described in the above-described embodiments.

The surface step formed by a buried material in trenches varies depending on conditions, etc. for forming films by CVD method or electrolytic plating method. The polishing ability of the CMP varies depending on materials to be polished, kinds of the slurry and the polishing cloth, and others. Accordingly, it is preferable that relationships among sizes of respective layout regions, maximum area percentages of prescribed patterns, and minimum space are obtained in advance, based on the method described in, e.g., the first embodiment, and, based on the result, they are suitably set.

Figure 18:
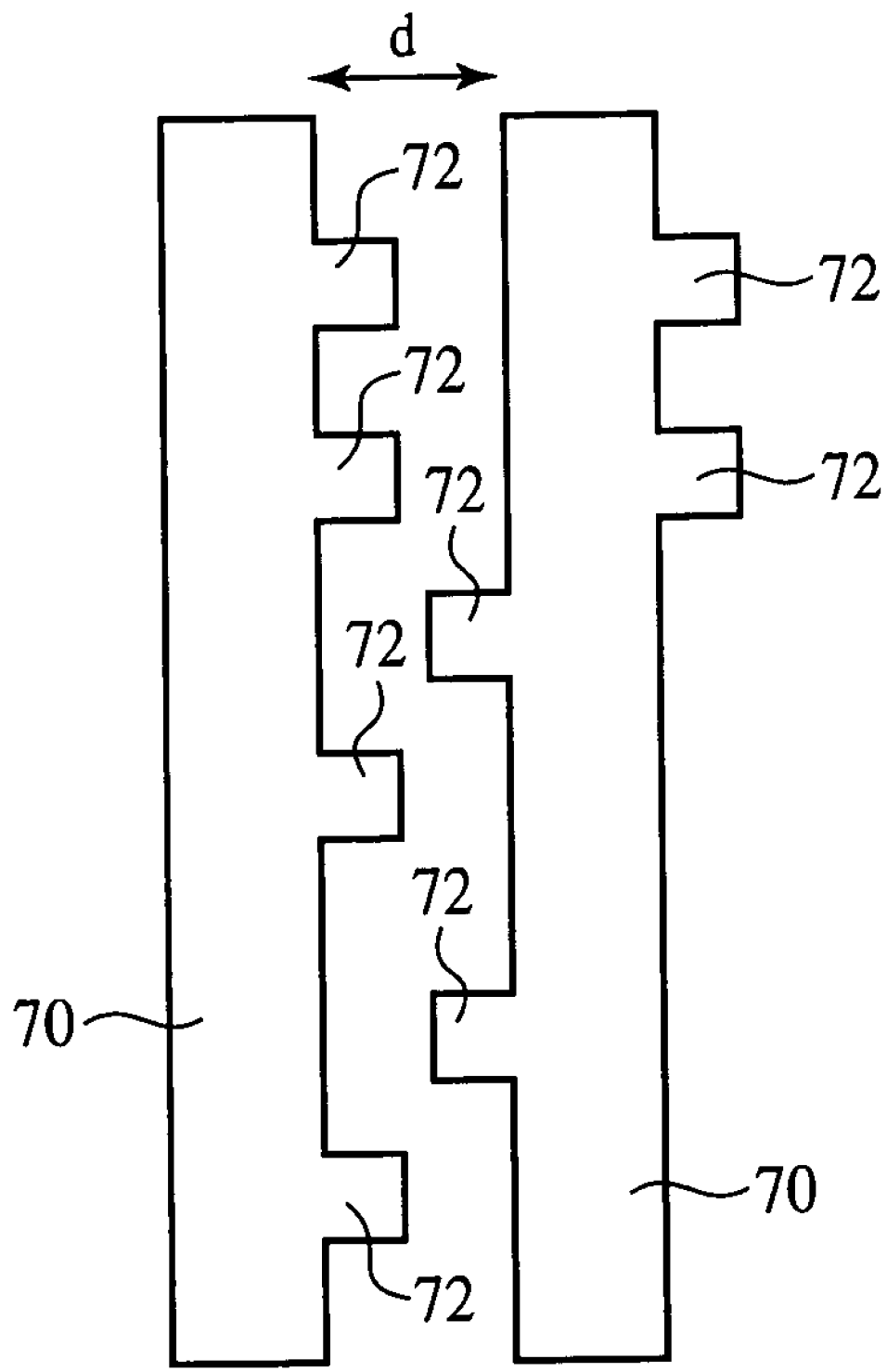
FIG. 18 is a plan view of a structure of the electronic device according to one modification of the present embodiments of the present invention.

In the above-described embodiments, simple line and space pattern is used. The minimum space between patterns means a minimum distance between rectangular patterns. However, the minimum distance is not essentially between rectangular patterns. For example, in the pattern 70 having the projections 72 shown in FIG. 18, the distance of the parts except the projections 72 can be the minimum space.

In the above-described embodiments, the electronic device is a semiconductor device, and the buried structures buried in the substrate are device isolation film and damascene interconnections. However, the electronic devices the present invention is applicable to are not limited to the semiconductor device. The present invention is applicable generally to electronic devices, such as thin film magnetic heads, etc., which are fabricated by steps including the polishing by CMP.

What is claimed is:

1. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in larger one of the layout regions, the minimum space between the patterns in the layout region being set larger,
the buried structures being a device isolation film buried in the semiconductor substrate,
the patterns being patterns of active region defined by the device isolation film,
the layout region having a size of not more than a 300 μm-square,
the maximum area percentage of the patterns of the active region being not less than 70%, and
the minimum space between the patterns of the active regions being not less than 0.25 μm.

2. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in that of the layout regions, where the maximum area percentage allowed for the patterns is higher, the minimum space between the patterns in the layout region being set larger,
the buried structures being a device isolation film buried in the semiconductor substrate,
the patterns being patterns of active region defined by the device isolation film,
the layout region having a size of not more than a 300 μm-square,
the maximum area percentage of the patterns of the active region being not less than 70%, and
the minimum space between the patterns of the active regions being not less than 0.25 μm.

3. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in larger one of the layout regions, the minimum space between the patterns in the layout region being set larger,
the buried structures being a device isolation film buried in the semiconductor substrate,
the patterns being patterns of active region defined by the device isolation film,
the layout region having a size of not more than a 700 μm-square,
the maximum area percentage of the patterns of the active regions being not less than 70%, and
the minimum space between the patterns of the active region being not less than 0.75 μm.

4. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in that of the layout regions, where the maximum area percentage allowed for the patterns is higher, the minimum space between the patterns in the layout region being set larger,
the buried structure being a device isolation film buried in the semiconductor substrate,
the patterns being patterns of active region defined by the device isolation film,
the layout region having a size of not more than a 700 m-square,
the maximum area percentage of the patterns of the active regions being not less than 70%, and
the minimum space between the patterns of the active region being not less than 0.75 μm.

5. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in larger one of the layout regions, the minimum space between the patterns in the layout region being set larger,
the buried structures being a conducting film buried in an insulating film,
the patterns being patterns of an interconnection formed of the conducting film,
the layout region having a size of not more than a 2 mm-square,
the maximum area percentage of the patterns of the interconnection being more than 50%, and
the minimum space between the patterns of the interconnection being not less than 120 nm.

6. An electronic device, comprising:
a plurality of layout regions each including a plurality of patterns defined by a buried structure buried in a substrate,
for each of the layout regions, a minimum space between the patterns and a maximum area percentage allowed for the patterns being defined based on a size of the layout region,
in that of the layout regions, where the maximum area percentage allowed for the patterns is higher, the minimum space between the patterns in the layout region being set larger,
the buried structures being a conducting film buried in an insulating film,
the patterns being patterns of an interconnection formed of the conducting film,
the layout region having a size of not more than a 2 mm-square,
the maximum area percentage of the patterns of the interconnection being more than 50%, and
the minimum space between the patterns of the interconnection being not less than 120 nm.

* * * * *